United States Patent [19]

Kadomura et al.

[11] Patent Number: 5,370,769
[45] Date of Patent: Dec. 6, 1994

[54] DRY ETCHING METHOD OF GAAS

[75] Inventors: Shingo Kadomura, Kanagawa; Junichi Sato, Tokyo, both of Japan

[73] Assignee: Sony Corporation, Tokyo, Japan

[21] Appl. No.: 966,531

[22] Filed: Oct. 26, 1992

[30] Foreign Application Priority Data

| Oct. 29, 1991 | [JP] | Japan | 3-308327 |
| Dec. 9, 1991 | [JP] | Japan | 3-324618 |
| Dec. 9, 1991 | [JP] | Japan | 3-324619 |
| Dec. 11, 1991 | [JP] | Japan | 3-359691 |
| Aug. 12, 1992 | [JP] | Japan | 4-215221 |

[51] Int. Cl.$^5$ ............................................. H01L 21/00
[52] U.S. Cl. ............................ 156/662; 156/643; 156/646; 156/651; 156/652; 156/656
[58] Field of Search ............... 156/643, 646, 662, 651, 156/656, 652

[56] References Cited

FOREIGN PATENT DOCUMENTS

| 0407169 | 1/1991 | European Pat. Off. |
| 0492951 | 7/1992 | European Pat. Off. |
| 04221825 | 8/1992 | Japan. |

OTHER PUBLICATIONS

"Damage Studies of Dry Etched Gallium Arsenide Recessed Gates For Field Effect Transistors", J. Vac. Sci., B; 9(1) pp. 114-119, 1991, Salimian et al.

"Reactive Ion Etch Process With Highly Controllable Gallium Arsenide To Aluminum Gallium Arsenide Selectivity Using Sulfur Hexafluoride and Silicon Tetrachloride", Salimia et al., Appl. Phys. Lett. 51(14), Abstract Only, 1987.

"Damage Studies of Dry Etched Gallium Arsenide Recessed Gates For Field Effect Transistors", J. Vac. Sci. Tech., B; 9(1); 1991; pp. 114-119.

"Selective Dry Etching of In GaAs and InP over A/InAs in $CH_4$, $H_2$, $SF_6$", Appl. Phys. Lett.; 56 (22); pp. 2186-2188; May 1990; Pearton et al.

"D.C. Plasma Etching of Silicon by Sulfur Hexafluoride . . . "; Wagner et al.; Plasma Chem. Plasma Process., 1(2), Abstract Only; 1981.

Saliman et al, "Reactive ion etch process with highly controllable GaAs-to-AlGaAs selectivity using $SF_6$ and $SiCl_4$", Applied Physics Letters, vol. 51, No. 14, 5 Oct. 1987, pp. 1083-1085.

Pelletier et al, "$S_2Br_2$, $S_2Cl_2$, $S_2F_2$: A New Line of Halogen-Containing Gases for Low-Pressure Plasma Etching Processes", Japanese Journal of Applied Physics, vol. 29, No. 9, Sep. 1990, pp. 1846-1853.

Salimian et al, "Selective dry etching of GaAs over AlGaAs in $SF_6/SiCl_4$ mixtures", Journal of Vacuum Science & Technology B, vol. 6, No. 6, Dec. 1988, pp. 1641-1644.

Hikosaka et al, "Selective Dry Etching of AlGaAs-GaAs Heterojunction", Japanese Journal of Applied Physics, vol. 20, No. 11, Nov. 1981, pp. L847-L850.

Primary Examiner—R. Bruce Breneman
Assistant Examiner—George Goudreau
Attorney, Agent, or Firm—Hill, Steadman & Simpson

[57] ABSTRACT

A method of dry etching a GaAs/AlGaAs stacked system with high selectivity without employing a chlorofluorocarbon (CFC) gas. When selectively etching an n+-GaAs layer stacked on an n+-AlGaAs layer for forming e.g. a gate recess of a high electron mobility transistor (HEMT), a gas having a composition capable of yielding free sulfur (S) and fluorine radicals (F*) in a plasma under conditions of discharge dissociation is used as an etching gas. S is deposited on a pattern sidewall to form a sidewall protection film to contribute to anisotropic etching. On the other hand, F* plays the role of formation of $AlF_x$ with low vapor pressure on an exposed surface of the underlayer of n+-AlGaAs to stop etching, to say nothing of a role of an etchant. Although a gas system which is by far the simplest is a mixed system of $S_2F_2$/Xe, a gas system may be employed which is capable of generating Cl* or Br* for producing a reaction product having a high vapor pressure or augmenting S deposition. More concretely, mixed systems of $S_2F_2/Cl_2$, $S_2F_2/S_2Cl_2$ or $S_2Cl_2/ClF_3$ may be employed.

39 Claims, 2 Drawing Sheets

DRY ETCHING METHOD OF GAAS

BACKGROUND OF THE INVENTION

This invention relates to a dry etching method applicable to the fabrication of semiconductor devices. More particularly, it relates to a method of selective etching of GaAs/AlGaAs in a process step during formation of a gate recess of a high electron mobility transistor (HEMT) without employing a chlorofluorocarbon (CFC) gas.

A monolithic microwave IC in which a GaAs MES-FET (metal semiconductor field effect transistor) is integrated on a single substrate, has characteristics such is high speed high frequency response, low noise or low power consumption, and is recently used as a device for mobile communication or satellite communication.

In 1980, the high electron mobility transistor (HEMT) has been developed from researches aimed at a higher operating speed of the above-mentioned GaAs MES-FET. The HEMT is a device in which advantage is taken of a two-dimensional electron gas at a hetero junction of the GaAs compound semiconductor being moved at a high velocity without being subject to scattering by impurities. Researches towards realization of a high integration in HEMT are proceeding currently and demands are raised for higher precision and higher selectivity ratio of the dry etching technique for realization of the higher integration.

The process of selective etching of a GaAs/AlGaAs stacked system for forming a gate recess is an important technique of determining a threshold voltage of a hereto-junction FET such as HEMT or hereto MIS structure FET. It is because the concentration of impurities and thicknesses etc. in the lower AlGaAs layer are preset so that an FET having a reasonable threshold voltage may be produced by removing only the upper GaAs layer. The method for selective etching of the GaAs layer on the AlGaAs layer may be typified by a method employing a gas mixture composed of chlorofluorocarbon gases (CFC gases), such as $CCl_2F_2$, and rare gases. The reason is that the GaAs layer is removed mainly in forms of chlorides of Ga and As, and fluoride of As, and that $ALF_3$ having a low vapor pressure is formed on the surface on exposure of the underlying AlGaAs layer to lower the etching rate to achieve a high selectivity ratio.

For example, a report has been made of an example of achieving a selectivity ratio of 200 using a $CCl_2F_2$/He mixed gas in e.g. Japanese Journal of Applied Physics, Vol. 20, No. 11 (1981) p. L847 to 850.

However, the above-mentioned selective dry etching method suffers from the following disadvantages.

First, the above-mentioned CFC gases, such as $CCl_2F_2$, are thought to cause destruction of an ozone layer surrounding the earth in a known manner, so that a ban will be placed on the production and use of these gases in the near future. It is therefore incumbent to develop substitute gases and the technology of application of these substitute gases in the field of dry etching.

On the other hand, the CFC gasses tend to produce a large quantity of the fluorocarbon-based polymer in an etching reaction system. This polymer, while being deposited on the pattern sidewall to display sidewall protection effects to contribute to anisotropic etching, tends to produce instability of the etchrate and a deteriorated level of pollution by particles.

Besides, annealing at a temperature on the order of 300° C. becomes necessary for remedying damages by ion radiation during etching.

OBJECT AND SUMMARY OF THE INVENTION

It is an object of the present invention to provide a method of selective etching of an Al-free compound semiconductor layer on an Al-containing compound semiconductor layer with high selectivity ratio, high anisotropy, low contamination and low damage without employing the CFC gases.

The present inventor thought that some sidewall projecting substances other than the conventional fluorocarbon based polymer, which will be deposited only under particular conditions and which may be removed easily and completely when they become redundant, are required for achieving a highly anisotropic etching with low contamination, and directed their attention to sulfur (S). Sulfur yielded in a plasma is adsorbed on a wafer surface, in a temperature range lower than about 90° C., depending on etching conditions. On the other hand, sulfur deposited on a pattern sidewall where perpendicular incidence of ions is not produced as a principle, is directly deposited thereon to display sidewall protection effects. Besides, on termination of etching, sulfur is sublimated easily by heating the wafer to a temperature of about 90° C. or higher. If the process of ashing a resist mask is involved, sulfur may be burned off simultaneously with the resist mask. At any rate, sulfur does not cause pollution by particles.

Therefore, in the present invention, a compound capable of releasing free sulfur in a plasma under conditions of discharge dissociation is required as a component of an etching gas.

On the other hand, as long as selectivity in etching of the Al-free compound semiconductor layer/Al-containing compound semiconductor layer is basically based as a principle on generation of $ALF_x$, a compound capable of releasing F* is also required as a constituent component of the etching gas.

In this manner, it is indispensable that both S and F* be released into the plasma. Besides, a compound containing halogen or other elements may be selected suitably and added to the etching gas depending on the particular constituent elements of the Al-free compound semiconductor layer in order to provide a vapor pressure large enough to eliminate the etching reaction products or to remove the etching reaction products by ion sputtering.

If the above essential conditions are to be satisfied by substantially a sole compound, an etching gas containing a depositable fluorine compound capable of yielding free sulfur in a plasma under conditions of discharge dissociation may be employed. The etching reaction products, yielded at this time, are mainly fluorides of constituent elements of the compound semiconductor layers.

The above-mentioned depositable fluorine compounds may be admixed with chlorine or bromine compounds capable of donating Cl or Br to the etching reaction system. In this manner, chlorides or bromides may be yielded as etching reaction products in addition to the above-mentioned fluorides. There may also be expected sputtering effects by ions such as $Cl^+$ or $BF^+$. Although these chlorine or bromine compounds may be depositable or non-depositable, depositable compounds are particularly desirable since these supplement sulfur deposition.

Meanwhile, for further improving selectivity of the underlying Al-containing compound semiconductor layer in the above-described processes, it is most effective to divide the etching process for the Al-free compound semiconductor layer into a just-etching process and an overetching process and to raise the ratio of the depositable fluorine compound in the etching gas during the latter process or the overetching process for increasing the quantity of F* in the etching reaction system during the overetching process. Since the underlying Al-containing compound semiconductor layer is partially exposed during the overetching process, formation of $ALF_x$ may be promoted by increasing F* by increasing the quantity of F* to raise the selectivity.

Although the just-etching process proceeds under conditions of a lesser quantity of F*, this may be favorable for certain compositions of the Al-free compound semiconductor layer. For example, if the Al-free compound semiconductor layer is a GaAs layer, and the quantity of F* produced during the just-etching process is excessive, a large quantity of $GaF_3$ with a low vapor pressure is produced to hinder the smooth progress of the etching. However, such risk may be avoided by increasing the quantity of F* only in the course of the overetching process.

Besides, in a process employing a mixture only of depositable compounds, the S/X ratio of the reaction system, where S indicates the number of S atoms and X the number of halogen atoms, may be finely controlled by employing non-depositable halogen compounds, For example, if non-depositable chlorine compounds are added to an etching gas containing at least one of depositable chlorine compounds and the depositable fluorine compounds and depositable fluorine compounds, the quantity of Cl* in the etching reaction system is increased. In this manner, chlorides having a high vapor pressure are yielded as etching reaction products to raise the etchrate. On the other hand, the increase in Cl* lowers the S/Cl ratio in the etching reaction system (the ratio of the number of S atoms to that of Cl atoms) to inhibit excess sulfur deposition. Consequently, high etchrate anisotropic etching may be assured by optimizing the quantity of the addition of the non-depositable chlorine compounds within the extent of not impeding the formation of a sidewall protective film.

After the just-etching process employing the above etching gas, it is possible to carry out an overetching process by eliminating non-depositable chlorine compounds from the composition of the above-mentioned etching gas. Since the quantity of the Cl* yielded during overetching is decreased, the etching rate is lowered and sulfur deposition is promoted to improve underlayer selectivity additionally.

On the other hand, fluorine compounds may also be added as non-depositable halogen compounds, In this case, the quantity of F* in the etching reaction system is increased to lower the S/F ratio (the ratio of the number of sulfur atoms to that of fluorine atoms). This prevents the etching rate from being lowered while preventing the difference in dimensional conversion from being produced due to excess S deposition. Besides, formation of $ALF_3$ is promoted to achieve by the increase in F* to achieve high underlayer selectivity.

After the just-etching process employing the above etching gas, it is possible to carry out an overetching process by eliminating non-depositable fluorine compounds from the composition of the above-mentioned etching gas. Since the amount of F* produced during overetching is decreased, the amount of $ALF_3$ is decreased. However, high selectivity is achieved because the S/F ratio is increased to promote sulfur deposition.

In the above-described etching gases, depositable fluorine compounds are contained as essential components and a variety of halogens are added for achieving high etching rate and high selectivity.

In the following etching gases, a source of F* is separated from a source of S. That is, at least one of depositable chlorine compounds and depositable bromine compounds and non-depositable fluorine compounds are used. In this case, S is supplied from the depositable chlorine compounds or the depositable bromine compounds, while F* are supplied from the non-depositable fluorine compounds. The etching mechanism is the same as that described in connection with the above embodiments.

The present invention also proposes adding one of $H_2$ and $H_2S$ to the etching gas as a method of controlling the S/X ratio without addition of halogen radicals. These compounds yield H* which capture halogen radicals in the etching reaction system to remove them in the form of hydrogen halides to promote the apparent S/X ratio, that is S deposition, in the etching reaction system. Above all, if $H_2S$ is used, since this compound itself is a source of S, the effect in increasing the S/X ratio may be increased additionally.

These compounds may be used not only in the process carrying out a one-stage etching without changing the gas composition but also in the process carrying out a two-stage etching of just-etching and overetching. In any case, the underlayer selectivity may be increased. Above all, in a process comprising two-stage etching, it is only sufficient if $H_2$ or $H_2S$ be added only during the over-etching process. It is because halogen radicals which become relatively excessive with decrease in an etched area during the over-etching process may be captured by addition of $H_2$ or $H_2S$ and also because deposition of S is promoted to prevent anisotropic shape or selectivity from being deteriorated. This process has an advantage that, since the just-etching proceeds under conditions of a relatively low S/X ratio, the etchrate of the process in its entirety is not lowered significantly.

Besides, in the process employing two-stage etching, the selectivity ratio may be improved by a factor other than the etching gas composition, that is by decreasing the incident ion energy to a value lower than that in the just-etching process. This inhibits sputtering off of S deposited on the perpendicular ion incident surface or $ALF_x$ formed on an exposed surface of the Al-containing compound semiconductor layer to achieve high selectivity. Of course, damages to the underlayer may also be diminished significantly.

It is seen from the above that, according to the present invention, selective anisotropic etching of a stacked system of Al-free and Al-containing compound semiconductors, typified by a GaAs/AlGaAs stacked system, may be achieved under lower bias conditions with high anisotropy, high selectivity and low damage without employing CFC gases. In addition, since S, which is liable to be sublimated is used for sidewall protection, low pollution may also be achieved.

Thus the present invention is highly effective for producing a semiconductor device employing e.g. compound semiconductors based on an extremely fine design rule and contributes significantly to preparation of MMICs through high integration.

BRIEF DESCRIPTION OF THE INVENTION

The present invention is hereinafter explained with reference to Examples,

EXAMPLE 1

In the present Example, for forming a gate recess for a HEMT, an $n^+$-GaAs layer on an $n^+$-AlGaAs layer was selectively etched, using an $S_2F_2$/Xe mixed gas to form a recess before forming a gate electrode. This process is explained by referring to FIGS. 1 to 5.

Figure 1:
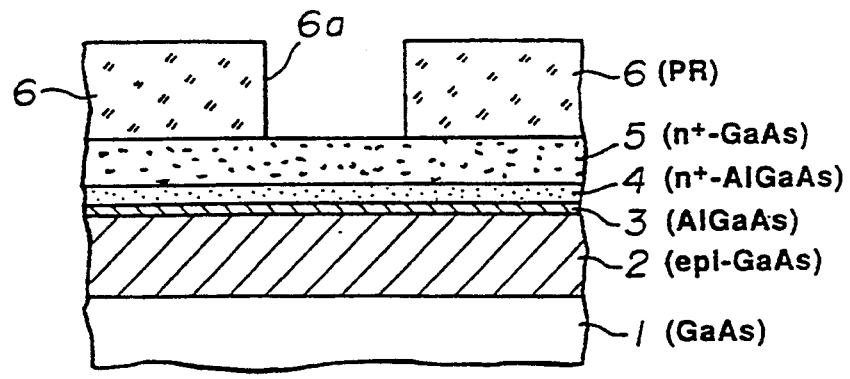
FIG. 1 is a schematic cross-sectional view showing the state in which a resist mask has been formed on an $n^+$-GaAs layer in a typical process in which the present invention is applied during formation of a gate recess in a HEMT.

A wafer used in the present Example as an etching sample was made up of an epi-GaAs layer 2, grown about 500 nm thick on a semiinsulating GaAs substrate 1, functioning as a buffer layer, an AlGaAs layer 3, about 2 nm thick, an $n^+$-AlGaAs layer 4, about 30 nm thick, doped with n-type impurities, such as Si, an $n^+$-GaAs layer 5, about 100 nm thick, similarly containing n-type impurities, and a resist mask 6 (PR) patterned to a predetermined shape, stacked together in this order, as shown in FIG. 1. The resist mask 6 was patterned by light exposure by an electron beam lithography method and development, with the diameter of an opening 6a being about 300 nm.

For etching the hi-GaAs layer 5, the wafer was set on an RF bias type magnetic microwave plasma etching device. Etching was carried out under typical etching conditions of an $S_2F_2$ flow rate of 20 SCCM, an Xe flow rate of 50 SCCM, a gas pressure of 1.3 Pa (10 mTorr), a microwave power of 850 W (2.45 GHz) and an RF bias power of 100 W (2 MHz).

Figure 2:
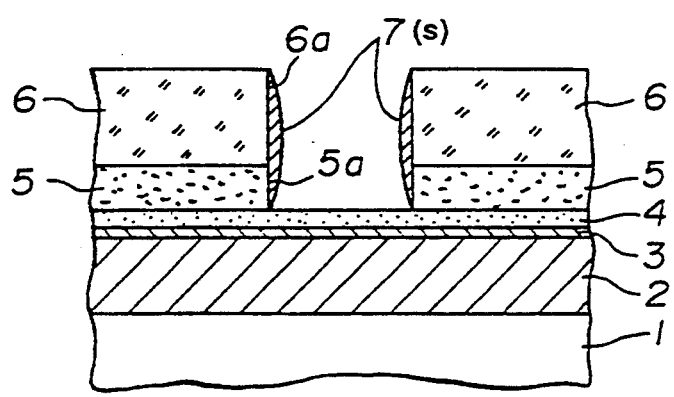
FIG. 2 is a schematic cross-sectional view showing the state in which the $n^+$-GaAs layer of FIG. 1 is etched with formation of a sidewall protection film to form the gate recess.

It is noted that $S_2F_2$ is one of the sulfur fluorides employed in etching a layer of a silicon-based material, as reported by the present inventors in Extended Abstract of the 38th Spring Meeting (1991) of the Japan Society of Applied Physics, p.503, lecture number 28p-ZC-3. F* yielded from $S_2F_2$ extracts As in the $n^+$-GaAs layer 5 in the form of $AsF_3$ or $AsF_5$. This radical reaction was assisted by incident ions such as $S^+$ or $SF_x^+$. Although fluorides of Ga $GaF_x$, typified by $GaF_3$, were also yielded at this time, these fluorides wear a solid having a high sublimation temperature. Consequently, the mechanism of elimination of Ga, $GaF_3$ etc. was mainly the sputtering by Xe accelerated under high bias conditions. On the other hand, free sulfur was yielded in a plasma under conditions of discharge dissociation by $S_2F_2$ in a manner different from $SF_6$ which is also a sulfur fluoride customarily used as an etching gas. Sulfur thus yielded was deposited on the pattern sidewall where perpendicular ion incidence could not occur as a principle to form a sidewall protective film 7, as shown in FIG. 2.

As a result thereof, etching proceeded anisotropically to form a recess 5a having a vertically extending wall. When the $n^+$-AlGaAs layer 4 was exposed, $ALF_x$, x being mainly 3, was formed on its surface to lower the etching rate significantly to achieve a high selectivity ratio. It is because $ALF_x$ may function as an etching mask even under conditions that $GaF_x$ was sputtered off, as may be surmised from the fact that $ALF_3$ has a melting point of 1291℉C. which is higher than the boiling point of $GaF_3$ which is about 1000℉C.

Meanwhile, rare gases such as Ne, At, Kr or Rn may also be added to the etching gas, besides Xe, in expectation of their sputtering effects.

Figure 3:
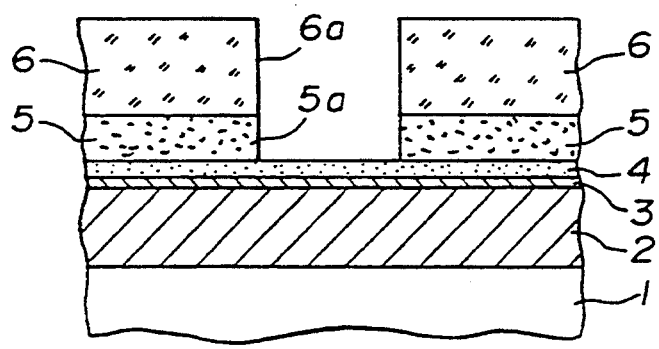
FIG. 3 is a schematic cross-sectional view showing the state in which the sidewall protection film shown in FIG. 2 has been removed.

The sidewall protecting film 7 could be readily sublimed off, as shown in FIG. 3, by heating the wafer to about 90℉C. after the end of etching, without causing pollution by particles on the wafer.

Figure 4:
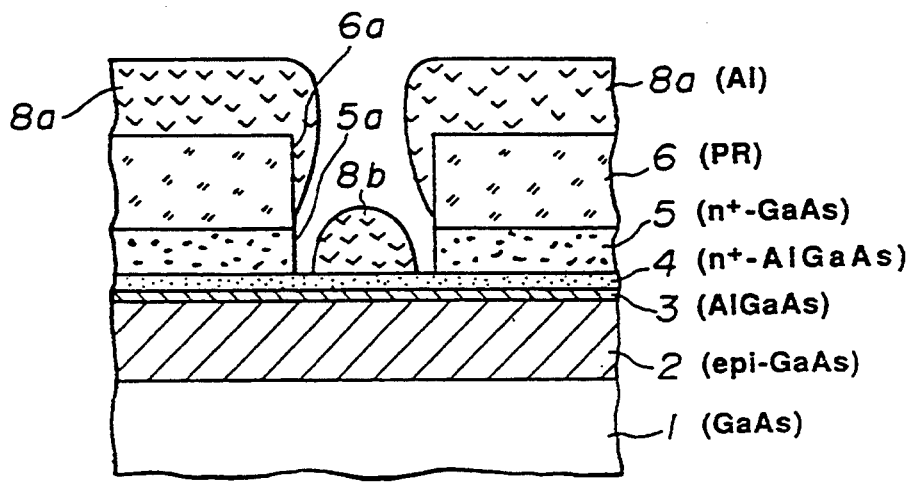
FIG. 4 is a schematic cross-sectional view showing the state in which an Al layer has been deposited on the resist mask surface and the bottom of the recess.
Figure 5:
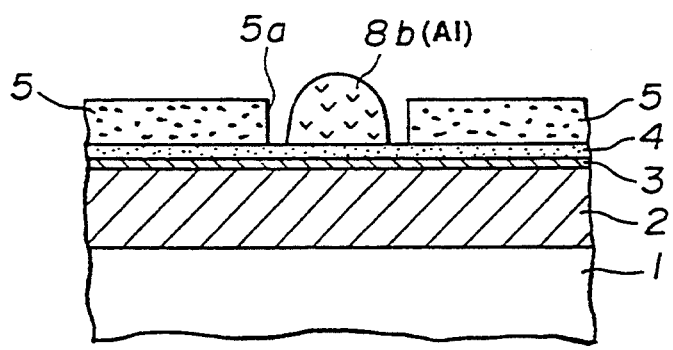
FIG. 5 is a schematic cross-sectional view showing the state in which the resist mask and an upper Al layer on its surface have been removed and a lower Al layer (gate electrode) has been left only on the bottom of the recess.

An layer of about 200 nm thick was formed by electron beam deposition, as an example. This Al deposition was carried out by intentionally utilizing the fact that step coverage was deteriorated within recess 5a having an extremely small opening diameter. Thus an upper Al layer 8a was formed on the surface of the resist mask 6 and a lower Al layer 8b which later become a gate electrode was formed on the bottom of the recess 5a, as shown in FIG. 4. After lifting off the resist mask 6 as conventionally, the upper Al layer 8a was simultaneously removed, as shown in FIG. 5, so that only the lower Al layer 8b was left on the bottom of the recess 5a so as to be used as the gate electrode.

EXAMPLE 2

In the present Example, the $n^+$-GaAs layer on the $n^+$-AlGaAs layer was selectively etched, using an $S_2F_2$/$Cl_2$ mixed gas, for etching a gate recess for the HEMT.

The wafer used in FIG. 1 was used in the present Example, as in the following Examples. This wafer was set on a wafer setting electrode of an RF bias type magnetic microwave plasma etching device. An alcoholic coolant medium was supplied from e.g. a chiller mounted outside the device to a cooling pipe enclosed in the wafer setting electrode for cooling the wafer. The $n^+$-GaAs layer 5 was etched under typical etching conditions of an $S_2F_2$ flow rate of 25 SCCM, a $Cl_2$ flow rate of 15 SCCM, a gas pressure of 1.3 Pa (10 mTorr), a microwave power of 850 W (2.45 GHz), an RF bias power of 20 W (2 MHz) and a wafer temperature of $-10$℉C.

During this etching process, Cl took part in etching to add to the etching mechanism described in Example 1. That is, Ga and As in the $n^+$-GaAs layer 5 were removed in the form of fluorides and chlorides. Above all, since chlorides of Ga are low both in melting point (77.9℉C.) and in boiling point (201/3℉C.) as compared to fluorides thereof, etching proceeded under low bias conditions without resorting to the sputtering operation of rare gas ions as described above. The mechanism of sidewall protection and of achieving underlayer selectivity was the same as that explained in Example 1.

EXAMPLE 3

In the present Example, similar etching was carried out using an $S_2F_2/Cl_2/H_2S$ mixed gas under typical etching conditions of an $S_2F_2$ flow rate of 20 SCCM, a $Cl_2$ flow rate of 30 SCCM, an $H_2S$ flow rate of 10 SCCM, a gas pressure of 1.3 Pa (10 mTorr), a microwave power of 850 W (2.45 GHz), an RF bias power of 5 W (2 MHz) and a water temperature of $-10°C$.

The above etching gas composition was equivalent to the composition of Example 2 admixed with $H_2S$. Since $H_2S$ captured $F^*$ or $Cl^*$ in the etching gas reaction system by $H^*$ yielded on its dissociation, while also supplying S, it had a significant effect in raising the apparent S/X ratio in the system. That is, since the sidewall protecting effect was augmented, good anisotropy was realized even although the RF bias power was additionally decreased.

EXAMPLE 4

In the present Example, after the $n^+$-GaAs layer was just-etched using an $S_2F_2/Cl_2$ mixed gas, over-etching was carried out using an $S_2F_2/Cl_2H_2S$ mixed gas. The just-etching was carried out under typical etching conditions of an $S_2F_2$ flow rate of 25 SCCM, a $Cl_2$ flow rate of 15 SCCM, a gas pressure of 1.3 Pa (10 mTorr), a microwave power of 850 W (2.45 GHz), an RF bias power of 20 W (2 MHz) and a wafer temperature of $-10°C$.

The etching mechanism during this process was the same as that explained in Example 2.

The over-etching was then carried out under typical conditions of an $S_2F_2$ flow rate of 25 SCCM, a $Cl_2$ flow rate of 15 SCCM, an $H_2S$ flow rate of 10 SCCM, a gas pressure of 1.3 Pa (10 mTorr), a microwave power of 850 W (2.45 GHz), an RF bias power of 10 W (2 MHz) and a wafer temperature of $-10°C$.

During this process, since the apparent S/X ratio of the etching reaction system was raised by addition of $H_2S$, the anisotropic shape was not deteriorated even after the over-etching. Since the RF bias power was also lowered, damages were not produced.

EXAMPLE 5

In the present Example, the $n^+$-GaAs layer was etched using an $S_2F_2/S_2Cl_2$ mixed gas under typical etching conditions of an $S_2F_2$ flow rate of 20 SCCM, a $_2Cl_2$ flow rate of 20 SCCM, a gas pressure of 1.3 Pa (10 mTorr), a microwave power of 850 W (2.45 GHz), an RF bias power of 20 W (2 MHz) and a wafer temperature of $-10°C$.

It is noted that $S_2Cl_2$ is among sulfur chlorides previously proposed by the present inventor as an etching gas for etching a layer of a silicon-based material of an Al-containing material. Although the etching mechanism in the present embodiment was similar to that of Example 2, the sidewall protecting effect was additionally improved because both $S_2F_2$ and $S_2Cl_2$ served as a supply source for S.

Meanwhile, comparable effects were obtained by etching while employing $S_2Br_2$ in place of $S_2Cl_2$ under otherwise the same conditions. Under the above conditions, bromides of As or Ga could be removed without raising the RF bias power.

EXAMPLE 6

In the present Example, the etching shown in Example 5 by the $S_2F_2/S_2Cl_2$ mixed gas was carried out in two steps and the ratio of $S_2F_2$ in the etching gas during the over-etching step was raised.

The just-etching was carried out under conditions of an $S_2F_2$ flow rate of 20 SCCM (proportion, 50%), an $S_2Cl_2$ flow rate of 20 SCCM, and a gas pressure of 1.3 Pa (10 mTorr), a microwave power of 850 W (2.45 GHz), an RF bias power of 20 W (2 MHz) and a wafer temperature of $-10°C$.

The over-etching was then carried out under the similar conditions except, altering the flow rate of $S_2F_2$ as 30 SCCM (proportion, 75%), and the flow rate of $S_2Cl_2$ as 10 SCCM.

With this over-etching step, a molar ratio of $F^*$ to $Cl^*$ was markedly raised while the total number of mole of sulfur in the etching gas was kept unchanged as compared with that in the just-etching step. That is, $F^*$ became excessive to make conditions advantageous in forming $ALF_x$. Formation of $ALF_x$ on the exposed surface of $n^+$-AlGaAs layer 4 was thus promoted and a high value of about 30 for the selectivity ratio for that layer was obtained in the over-etching step.

EXAMPLE 7

In the present Example, similar etching was carried out using an $S_2F_2/S_2Br_2$ mixed gas under etching conditions of an $S_2F_2$ flow rate of 20 SCCM (proportion, 50%), an $S_2Br_2$ flow rate of 20 SCCM, a gas pressure of 1.3 Pa (10 mTorr), a microwave power of 850 W (2.45 GHz), an RF bias power of 20 W (2 MHz) and a wafer temperature of $-10°C$., after which an over-etching step was carried out under a raised proportion of $S_2F_2$ to $S_2Br_2$ in the gas and under a lower RF bias power.

The over-etching was carried out by altering the conditions typically as an $S_2F_2$ flow rate 30 SCCM (proportion, 75%), an $S_2Br_2$ flow rate of 10 SCCM, a gas pressure of 1.3 Pa (10 mTorr), a microwave power of 850 W (2.45 GHz), an RF bias power of 10 W (2 MHz) and a water temperature of $-10°C$.

With this over-etching step, the selectivity ratio was raised to about 60 because more $F^*$ radicals were produced than $Br^*$ to promote generation of $ALF_x$ and the RF bias power was lowered to diminish the ion incident energy.

EXAMPLE 8

In the present Example, the $n^+$-GaAs layer was etched using an $S_2F_2/S_2Cl_2/Cl_2$ mixed gas under just-etching conditions of an $S_2F_2$ flow rate of 20 SCCM, an $S_2Cl_2$ flow rate of 20 SCCM, a $Cl_2$ flow rate of 5 SCCM, a gas pressure of 1.3 Pa (10 mTorr), a microwave power of 850 W (2.45 GHz), an RF bias power of 20 W (2 MHz) and a wafer temperature of $-10°C$. (with use of an alcoholic coolant).

The above etching conditions were the same as those of Example 2 except adding $Cl^*$ to the etching gas. With this etching process, a high etching rate could be achieved because $Cl^*$ radicals were increased in quantity in the etching reaction system to produce chlorides such as $AsCl_3$ or $GaCl_3$ having high vapor pressures efficiently and the S/X ratio was lowered. The underlayer selectivity ratio for this process was about 30.

EXAMPLE 9

In the present Example, similar etching was carried out using an $S_2F_2/S_2Br_2/Cl_2$ mixed gas under etching conditions of an $S_2F_2$ flow rate of 20 SCCM, an $S_2Br_2$ flow rate of 15 SCCM, a $Cl_2$ flow rate of 5 SCCM, a gas pressure of 1.3 Pa (10 mTorr), a microwave power of 850 W (2.45 GHz), an RF bias power of 20 W (2 MHz) and a water temperature of $-10\mp$C..

The above etching gas composition was the same as that of Example 8 except substituting $S_2Br_2$ for $S_2Cl_2$ of Example 8, and etching proceeded by substantially the same mechanism as that of Example 8 except, that bromides were also formed as a reaction product.

The underlayer selectivity ratio of the present Example was about 30.

EXAMPLE 10

In the present Example, the $n^+$-GaAs layer was just-etched, using an $S_2F_2/S_2Cl_2/Cl_2$ mixed gas under just-etching conditions of an $S_2F_2$ flow rate of 20 SCCM, an $S_2Cl_2$ flow rate of 15 SCCM, a $Cl_2$ flow rate of 5 SCCM, a gas pressure of 1.3 Pa (10 mTorr), a microwave power of 850 W (2.45 GHz), an RF bias power of 20 W (2 MHZ) and a wafer temperature of $-10\mp$C. (with use of an alcoholic cooling agent), after which an over-etching step was carried out using an $S_2F_2/S_2Cl_2$ mixed gas under a lower RF bias power condition.

The over-etching was carried out for removing the residual $n^+$-GaAs layer 5 under typical etching conditions of an $S_2F_2$ flow rate of 25 SCCM, an $S_2Cl_2$ flow rate of 15 SCCM, a gas pressure of 1.3 Pa (10 mTorr), a microwave power of 850 W (2.45 GHz), an RF bias power of 10 W (2 MHz) and a wafer temperature of $-10\mp$C..

The quantity of Cl* and that of S yielded during this over-etching process are compared to those in the just-etching process by simple calculation from the number of F atoms or S atoms in a molecule and by disregarding the discharge dissociation efficiency of the individual compounds and the recombination of chemical species. It is seen from this comparison that, under the above-mentioned over-etching conditions, the amount of Cl* was diminished by 25% and the amount of S was increased by 10% or more from those under the just-etching conditions, while the RF bias power was also halved.

That is, under the above-mentioned over-etching conditions, S deposition was promoted under the effects of the increase of the S/X ratio and the decrease in the incident ion energy. As a result thereof, the selectivity ratio with respect to the n*-AlGaAs layer 4 could be raised to about 60.

EXAMPLE 11

In the present Example, the $n^+$-GaAs layer was etched using an $S_2F_2/S_2Cl_2/SF_6$ mixed gas under typical etching conditions of an $S_2F_2$ flow rate of 20 SCCM, an $S_2Cl_2$ flow rate of 20 SCCM, an $SF_6$ flow rate of 5 SCCM, a gas pressure of 1.3 Pa (10 mTorr), a microwave power of 850 W (2.45 GHz), an RF bias power of 20 W (2 MHz) and a wafer temperature of $-10\mp$C. (with use of an alcoholic cooling agent). This etching gas composition was the composition of Example 5 admixed with $SF_6$. $SF_6$ contains S atoms in its molecule and scarcely releases free S even under discharge dissociation conditions, as experimentally confirmed by the present inventor. A large quantity of F* yielded from $SF_6$ were combined with part of free S so that the sidewall protecting film 7 was formed with a minimum thickness necessary to maintain the anisotropic shape without producing dimensional loss with respect to the resist mask 6. Since F* of the etching reaction system were increased, $ALF_x$ was formed with high efficiency on an exposed surface of the underlying $n^+$-AlGaAs layer 4 as soon as the layer 4 was exposed, so that high underlayer selectivity could be achieved.

EXAMPLE 12

In the present Example, similar etching was carried out using an $S_2F_2/S_2Br_2/SF_6$ mixed gas under etching conditions of an $S_2F_2$ flow rate of 30 SCCM, an $S_2Br_2$ flow rate of 15 SCCM, an $SF_6$ flow rate of 5 SCCM, a gas pressure of 1.3 Pa (10 mTorr), a microwave power of 850 W (2.45 GHz), an RF bias power of 20 W (2 MHz) and a wafer temperature of $-10\mp$C. (with the use of an alcoholic coolant).

The above etching gas composition was the same as that of Example 11 except substituting $S_2Br_2$ for $S_2Cl_2$ of Example 11. Etching proceeded by substantially the same mechanism as that of Example 11 except that bromides were formed as a reaction product instead of chlorides.

In the present Example, the recess 5a having a good anisotropic shape was formed and a selectivity ratio of about 30 with respect to the underlayer of the $n^+$-AlGaAs layer 4 could be achieved.

EXAMPLE 13

In the present Example, the $n^+$-GaAs layer was just-etched using an $S_2F_2/S_2Cl_2/SF_6$ mixed gas under just-etching conditions of an $S_2F_2$ flow rate of 20 SCCM, an $S_2Cl_2$ flow rate of 15 SCCM, an $SF_6$ flow rate of 5 SCCM, a gas pressure of 1.3 Pa (10 mTorr), a microwave power of 850 W (2.45 GHz), an RF bias power of 20 W (2 MHz) and a wafer temperature of $-10\mp$C. (with use of an alcoholic coolant), after which an over-etching step was carried out using an $S_2F_2/S_2Cl_2$ mixed gas under a lower RF bias power condition.

The etching mechanism during this just-etching process was as explained in Example 11.

Then, for removing the residual $n^+$-GaAs layer 5, an overetching was carried out by changing over to typical operating conditions of an $S_2F_2$ flow rate of 25 SCCM, an $S_2Cl_2$ flow rate of 15 SCCM, a gas pressure of 1.3 Pa (10 mTorr), a microwave power of 850 W (2.45 GHz), an RF bias power of 10 W (2 NHz) and a wafer temperature of $-10\mp$C..

The quantity of F* and that of S yielded during this over-etching process are compared to those in the just-etching process by simple calculation from the number of F atoms or S atoms in a molecule and by disregarding the discharge dissociation efficiency of the individual compounds and the recombination of chemical species. It is assumed that, since free S is not yielded from $SF_6$, up to five F* radicals at the maximum are yielded per molecule. It is seen from this comparison that, under the above-mentioned over-etching conditions, the amount of F* is diminished by 20% or more and the amount of S is increased by 10% or more from those under the just-etching conditions, while the RF bias power was also halved.

That is, under the above-mentioned over-etching conditions, S deposition was promoted under the effects of the increase of the S/X ratio and the decrease in the incident ion energy. As a result thereof, the selectivity ratio with respect to the $n^+$-AlGaAs layer 4 could be raised to about 60.

EXAMPLE 14

In the present Example, the $n^+$-GaAs layer was selectively etched using an $S_2Cl_2/ClF_3$ mixed gas under typical etching conditions of an $S_2Cl_2$ flow rate of 20

SCCM, a ClF$_3$ flow rate of 20 SCCM, a gas pressure of 1.3 Pa (10 mTorr), a microwave power of 850 W (2.45 GHz), an RF bias power of 20 W (2 MHz) and a wafer temperature of $-10°C$..

During this etching process, the radical reaction by Cl* yielded by dissociation from S$_2$Cl$_2$ and ClF$_3$ and by F* yielded by dissociation from ClF$_3$ was assisted by ions such as S$^+$, SCl$_x^+$, Cl$^+$ or ClF$_x^+$, while a sidewall protection film 7 was formed by S yielded from S$_2$Cl$_2$. On the other hand, high underlayer selectivity was achieved by contribution from from F* supplied from ClF$_3$.

Although the present invention has been explained with reference to Examples 1 to 14, the present invention is not limited by these examples, First, although a stacked system GaAs/AlGaAs was given in the above Examples as a stacked system of an Al-free compound semiconductor layer/Al-containing compound semiconductor layer, the present invention is applicable to other known stacked systems of Al-containing and Al-free compound semiconductors. For example, the present invention may also be applied to etching of a stacked system of two-element system/three element system, such as GaP/AlGaP, ZnP/AlInP, GaN/AlGaN or InAs/AlInAs, or to etching of a stacked system, such as a three element system/four element system.

Although S$_2$Cl$_2$ was used in the above Examples, SF$_2$, SF$_4$ or S$_2$F$_{10}$ may also be employed as depositable fluorine compounds.

Similarly, S$_3$Cl$_2$ or SCl$_2$ may also be employed as depositable chlorine compounds, besides S$_2$Cl$_2$.

As the depositable bromine compounds, S$_3$Br$_2$ or SBr$_2$ may also be employed besides S$_2$Br$_2$.

Also, as non-depositable chlorine compounds, BCl$_3$ or HCl may also be employed besides Cl$_2$.

Non-depositable bromine compounds give substantially the same results as those of non-depositable chlorine compounds. Although not recited concretely in the Examples, Br$_2$, BBr$_3$ or HBr may also be employed.

As the non-depositable fluorine compounds, NF$_3$XeF$_2$, HF, CLF, CLF$_3$, BrF$_3$ or BrF$_5$ may also be employed besides SF$_6$.

The present invention may be applied to processes in need of selective etching of a stacked system of an Al-free compound semiconductor/Al-containing compound semiconductor other than the above-described process for producing HEMT, such as the process of fabrication of laser devices or quantum Hall devices.

Besides, the etching devices, etching conditions or the wafer constitution may naturally be changed as desired.

What is claimed is:

1. A dry etching method for selective etching of an Al-free compound semiconductor layer stacked on an Al-containing compound semiconductor layer, characterized by
   carrying out etching using an etching gas containing at least sulfur fluoride capable of releasing free sulfur into a plasma under conditions; of discharge dissociation.

2. The dry etching as defined in claim 1 wherein said Al-containing compound semiconductor layer is an AlGaAs layer, said Al-free compound semiconductor layer is a GaAs layer and said sulfur fluoride is S$_2$F$_2$.

3. The dry etching method as defined in claim 1 wherein a rare gas(es) is added to said etching gas.

4. The dry etching method as defined in claim 1 wherein said etching gas contains at least one of H$_2$ or H$_2$S.

5. The dry etching method as defined in claim 1 comprising
   a just-etching step of etching said Al-free compound semiconductor layer in an amount substantially corresponding to its thickness using said etching gas, and
   an overetching step of etching a remaining portion of said Al-free compound semiconductor layer using said etching gas admixed with at least one of H$_2$ or H$_2$S.

6. The dry etching method as defined in claim 1 comprising
   a just-etching step of etching said Al-free compound semiconductor layer in an amount substantially corresponding to its thickness using said etching gas, and
   an overetching step of etching a remaining portion of said Al-free compound semiconductor layer using said etching gas admixed with at least one of H$_2$ OF H$_2$S and under conditions of a lower incident ion energy than in said just-etching step.

7. A dry etching method for selective etching of an Al-free compound semiconductor layer stacked on an Al-containing compound semiconductor layer, characterized by
   carrying out plasma etching using an etching gas containing, a sulfur fluoride capable of releasing free sulfur into a plasma under conditions of discharge dissociation and a constituent compound selected from the group consisting of a chlorine compound not containing sulfur and a bromine compound not containing sulfur.

8. The dry etching as defined in claim 7 wherein said Al-containing compound semiconductor layer is an AlGaAs layer, said Al-free compound semiconductor is a GaAs layer, said chlorine compound is Cl$_2$ and said sulfur fluoride is S$_2$F$_2$.

9. The dry etching method as defined in claim 7 wherein said etching gas contains at least one of H$_2$or H$_2$S.

10. The dry etching method as defined in claim 7 comprising
    a just-etching step of etching said Al-free compound semiconductor layer in an amount substantially corresponding to its thickness using said etching gas, and
    an overetching step of etching a remaining portion of said Al-free compound semiconductor layer using said etching gas admixed with at least one of H$_2$ or H$_2$S.

11. The dry etching method as defined in claim 7 comprising
    a just-etching step of etching said Al-free compound semiconductor layer in an amount substantially corresponding to its thickness using said etching gas, and
    an overetching step of etching a remaining portion of said Al-free compound semiconductor layer using said etching gas admixed with at least one of H$_2$ or H$_2$S and under conditions of a lower incident ion energy than in said just-etching step.

12. A dry etching method for selective etching of an Al-free compound semiconductor layer stacked on an Al-containing compound semiconductor layer, characterized by carrying out etching using an etching gas containing sulfur floride capable of producing sulfur under conditions of discharge dissociation, and at least one of the compound selected from the group consisting of a chlorine compound capable of releasing free sulfur into a plasma under conditions of discharge dissociation and a bromine compound capable of producing sulfur under similar conditions, a sulfur fluoride capable of producing sulfur under similar conditions.

13. The dry etching as defined in claim 12 wherein said Al-containing compound semiconductor layer is an AlGaAs layer, said Al-free compound semiconductor layer is a GaAs layer, said chlorine compound is $S_2Cl_2$, said bromine compound is $S_2Br_2$ and said sulfur fluoride is $S_2F_2$.

14. The dry etching method as defined in claim 12 wherein said etching gas contains at least one of $H_2$ or $H_2S$.

15. The dry etching method as defined in claim 12 comprising
a just-etching step of etching said Al-free compound semiconductor layer in an amount substantially corresponding to its thickness using said etching gas, and
an overetching step of etching a remaining portion of said Al-free compound semiconductor layer using said etching gas admixed with at least one of $H_2$ or $H_2S$.

16. The dry etching method as defined in claim 12 comprising
a just-etching step of etching said Al-free compound semiconductor layer in an amount substantially corresponding to its thickness using said etching gas, and
an overetching step of etching a remaining portion of said Al-free compound semiconductor layer using said etching gas admixed with at least one of $H_2$ or $H_2S$ and under conditions of a lower incident ion energy than in said just-etching step.

17. A dry etching method for selective etching of an Al-free compound semiconductor layer stacked on an Al-containing compound semiconductor layer, comprising a sulfur fluoride compound capable of producing sulfur under discharge dissociation, and at least one of a depositable chlorine compound capable of releasing free sulfur into a plasma under conditions, in an amount substantially corresponding to its thickness, of discharge dissociation or a bromine compound capable of producing sulfur under similar conditions, and a sulfur fluoride compound capable of producing sulfur under similar conditions, in an amount substantially corresponding to its thickness, and
an overetching step of etching a remaining portion of the Al-free compound semiconductor layer using an etching gas having the content ratio of said sulfur fluoride compound with respect to that of said chlorine compound or said bromine compound raised as compared to that in said just-etching step.

18. The dry etching method as defined in claim 17 wherein said Al-containing compound semiconductor layer is an AlGaAs layer, said Al-free compound semiconductor layer is a GaAs layer, said chlorine compound is $S_2Cl_2$, said bromine compound is $S_2Br_2$ and said sulfur fluoride compound is $S_2F_2$.

19. The dry etching method as defined in claim 18 wherein an incident ion energy is set so as to be smaller in said overetching step than that in said just-etching step.

20. A dry etching method for selective etching of an Al-free compound semiconductor layer stacked on an Al-containing compound semiconductor layer, characterized by
carrying out etching using an etching gas containing a sulfur fluoride compound capable of producing sulfur under discharge dissociation and a first chlorine compound incapable of releasing free sulfur in a plasma under conditions of discharge dissociation, and at least one of the compounds selected from the group consisting of a second chlorine compound capable of releasing free sulfur into a plasma under conditions of discharge dissociation and a bromine compound capable of producing sulfur under similar conditions a compound capable of producing sulfur under similar conditions and a second chlorine compound incapable of releasing free sulfur in a plasma under conditions of discharge dissociation.

21. The dry etching method as defined in claim 20 wherein said Al-containing compound semiconductor layer is an AlGaAs layer, said Al-free compound semiconductor layer is a GaAs layer, said chlorine compound is $S_2Cl_2$, said bromine compound is $S_2Br_2$, said sulfur fluoride compound is $S_2F_2$ and said second chlorine compound is $Cl_2$.

22. The dry etching method as defined in claim 20 wherein said etching gas contains at least one of $H_2$ or $H_2S$.

23. The dry etching method as defined in claim 20 comprising
a just-etching step of etching said Al-free compound semiconductor layer in an amount substantially corresponding to its thickness using said etching gas, and
an overetching step of etching a remaining portion of said Al-free compound semiconductor layer using said etching gas admixed with at least one of $H_2$ or $H_2S$.

24. The dry etching method as defined in claim 20 comprising
a just-etching step of etching said Al-free compound semiconductor layer in an amount substantially corresponding to its thickness using said etching gas, and
an overetching step of etching a remaining portion of said Al-free compound semiconductor layer using said etching gas admixed with at least one of $H_2$ or $H_2S$ and under conditions of a lower incident ion energy than in said just-etching step.

25. A dry etching method for selective etching of an Al-free compound semiconductor layer stacked on an Al-containing compound semiconductor layer, comprising
a just-etching step of etching said Al-free compound semiconductor layer using an etching gas containing a sulfur fluoride compound capable of producing sulfur under discharge dissociation, and a first chlorine compound incapable of releasing free sulfur in a plasma under conditions of discharge dissociation, and at least one of the compounds selected from the group consisting of a second chlorine compound capable of releasing free sulfur into a plasma under conditions of discharge dissociation and a bromine compound capable of producing sulfur under similar conditions, in an amount substantially corresponding to its thickness, and a compound capable of producing sulfur under similar conditions, and a second chlorine compound incapable of releasing free sulfur in a plasma under conditions of discharge dissociation, in an amount substantially corresponding to its thickness, and etching a remaining portion of said Al-free compound semiconductor layer using an etching gas which is said etching gas freed of said first chlorine compound.

26. The dry etching as method defined in claim 25 wherein said Al-containing compound semiconductor layer is an AlGaAs layer, said Al-free compound semiconductor layer is a GaAs layer, said chlorine compound is $S_2Cl_2$, said bromine compound is $S_2Br_2$, said sulfur fluoride compound is $S_2F_2$ and said first chlorine compound is $Cl_2$.

27. The dry etching method as defined in claim 25 wherein an incident ion energy is set so as to be smaller in said overetching step than that in said just-etching step.

28. A dry etching method for selective etching of an Al-free compound semiconductor layer stacked on an Al-containing compound semiconductor layer, characterized by carrying out etching using an etching gas containing a first sulfur fluoride compound capable of producing sulfur under discharge dissociation and a second sulfur fluorine compound incapable of releasing free sulfur in a plasma under conditions of discharge dissociation, at least one of the compounds consisting of a chlorine compound capable of releasing a compound capable of producing sulfur under similar conditions and a second fluorine compound incapable of releasing free sulfur in a plasma under conditions of discharge dissociation.

29. The dry etching as defined in claim 28 wherein said Al-containing compound semiconductor layer is an AlGaAs layer, said Al-free compound semiconductor layer is a GaAs layer, said chlorine compound is $S_2Cl_2$, said bromine compound is $S_2Br_2$, said sulfur fluoride compound is $S_2F_2$ and said second fluorine compound is $SF_6$.

30. The dry etching method as defined in claim 28 comprising a just-etching step of etching said Al-free compound semiconductor layer in an amount substantially corresponding to its thickness using said etching gas, and an overetching step of etching a remaining portion of said Al-free compound semiconductor layer using said etching gas admixed with at least one of $H_2$ or $H_2S$.

31. The dry etching method as defined in claim 28 comprising a just-etching step of etching said Al-free compound semiconductor layer in an amount substantially corresponding to its thickness using said etching gas, and an overetching step of etching a remaining portion of said Al-free compound semiconductor layer using said etching gas admixed with at least one of $H_2$ or $H_2S$ and under conditions of a lower incident ion energy than in said just-etching step.

32. A dry etching method for selective etching of an Al-free compound semiconductor layer stacked on an Al-containing compound semiconductor layer, comprising a just-etching step of etching said Al-free compound semiconductor layer using an etching gas containing a first sulfur fluoride compound capable of producing sulfur under discharge dissociation, and a second fluorine compound incapable of releasing free sulfur in a plasma under conditions of discharge dissociation, and at least one of the compounds selected from the group consisting of a chlorine compound capable of releasing free sulfur into a plasma under conditions of discharge dissociation and a depositable bromine compound capable of producing sulfur under similar conditions, a sulfur fluoride capable of producing sulfur under similar conditions, and a second fluorine compound incapable of releasing free sulfur in a plasma under conditions of discharge dissociation, in an amount substantially corresponding to its thickness, and, in an amount substantially corresponding to its thickness, and etching a remaining portion of said Al-free compound semiconductor layer using an etching gas which is said etching gas freed of said second fluorine compound.

33. The dry etching method as defined in claim 32 wherein said Al-containing compound semiconductor layer is an AlGaAs layer, said Al-free compound semiconductor layer is a GaAs layer, said depositable chlorine compound is $S_2Cl_2$, said depositable bromine compound is $S_2Br_2$, said depositable fluorine compound is $S_2F_2$ and said non-depositable fluorine compound is $SF_6$.

34. The dry etching method as defined in claim 32 wherein an incident ion energy is set so as to be smaller in said overetching step than that in said just-etching step.

35. A dry etching method for selective etching of an Al-free compound semiconductor layer stacked on an Al-containing compound semiconductor layer, characterized by carrying out etching using an etching gas containing the compounds selected from the group consisting of, free sulfur into a plasma under conditions of discharge dissociation and a bromine compound capable of producing sulfur under similar conditions under conditions.

36. The dry etching as defined in claim 35 wherein said Al-containing compound semiconductor layer is an AlGaAs layer, said Al-free compound semiconductor layer is a GaAs layer, said chlorine compound is $S_2Cl_2$, and said fluorine compound is $ClF_3$.

37. The dry etching method as defined in claim 35 wherein said etching gas contains at least one of $H_2$ or $H_2S$.

38. The dry etching method as defined in claim 35 comprising a just-etching step of etching said Al-free compound semiconductor layer in an amount substantially corresponding to its thickness using said etching gas, and an overetching step of etching a remaining portion of said Al-free compound semiconductor layer using said etching gas admixed with at least one of $H_2$ or $H_2S$.

39. The dry etching method as defined in claim 35 comprising a just-etching step of etching said Al-free compound semiconductor layer in an amount substantially corresponding to its thickness using said etching gas, and an overetching step of etching a remaining portion of said Al-free compound semiconductor layer using said etching gas admixed with at least one of $H_2$ or $H_2S$ and under conditions of a lower incident ion energy than in said just-etching step.

* * * * *